United States Patent [19]

Giori

[11] 4,036,130

[45] July 19, 1977

[54] INTAGLIO PRINTING PLATE MANUFACTURE

[75] Inventor: Gualtiero Giori, Lonay, Switzerland

[73] Assignee: De La Rue Giori S.A., Switzerland

[21] Appl. No.: 599,789

[22] Filed: July 28, 1975

[30] Foreign Application Priority Data

July 30, 1974 Switzerland ........................ 10442/74

[51] Int. Cl.² ........................ B41M 1/10; B24B 31/06; G03F 7/10

[52] U.S. Cl. .................................... 101/170; 51/164.5; 96/36.3; 101/150; 101/401.1

[58] Field of Search ...................... 101/150, 170, 401.1; 51/8 R, 164.5; 96/36.3

[56] References Cited

U.S. PATENT DOCUMENTS

| | | | |
|---|---|---|---|
| 1,155,352 | 10/1915 | Grass | 101/150 |
| 1,319,076 | 10/1919 | Hermann | 101/150 |
| 1,643,526 | 9/1927 | Stockinger | 101/170 |
| 2,291,854 | 8/1942 | Whyzmuzis | 101/401.1 |
| 2,338,558 | 1/1944 | Wickwire | 101/170 |
| 2,373,060 | 4/1945 | Sojka | 101/170 |
| 2,431,870 | 12/1947 | Huenerfauth et al. | 51/164.5 |
| 2,624,700 | 1/1953 | Morrison | 96/36.3 |
| 3,687,072 | 8/1972 | Pym | 101/150 |

FOREIGN PATENT DOCUMENTS

| | | | |
|---|---|---|---|
| 225,015 | 11/1924 | United Kingdom | 101/170 |
| 880AD | 1914 | United Kingdom | 101/150 |

*Primary Examiner*—Clyde I. Coughenour
*Attorney, Agent, or Firm*—Robert E. Burns; Emmanuel J. Lobàto; Bruce L. Adams

[57] ABSTRACT

An intaglio printing plate is prepared by coating a copperplate-engraved plate having a superficial chromium layer with an ink-accepting material such as a hardenable epoxy or acrylic resin, an enamel varnish, or a chemically or electrolytically deposited metal, and removing said layer from the non-grooved parts by treatment in a ball-graining machine. The ink-accepting material remaining in the grooves forms concave recesses suitable for wet offset printing with the precision, complexity and fineness of a copperplate design.

9 Claims, 2 Drawing Figures

FIG. 1
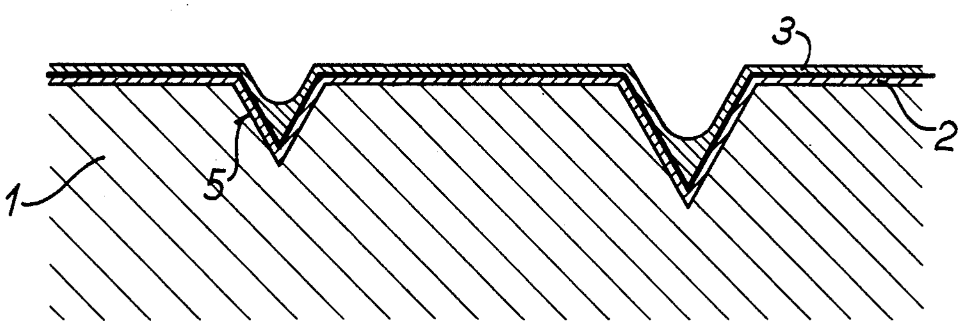
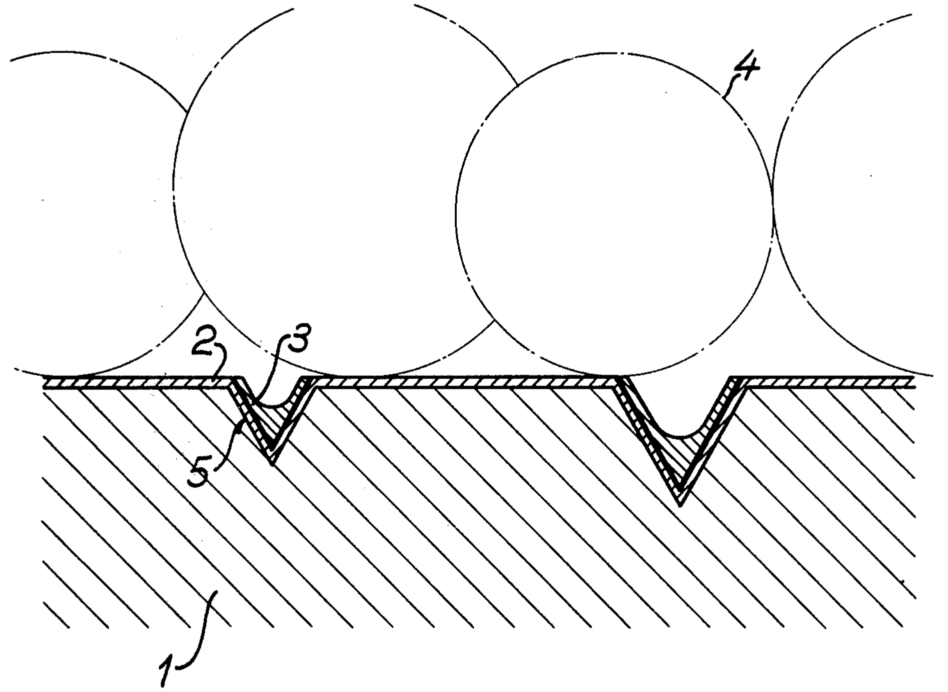
FIG. 2

INTAGLIO PRINTING PLATE MANUFACTURE

The invention relates to intaglio printing plates, their method of manufacture and printing machines incorporating such plates.

The known copperplate printing process is suitable for high quality printing, for example of banknotes. Copperplate printing plates have finely engraved grooves of different depths, and with such plates a very fine and very complex design can be produced, as well as a three-dimensional relief of the imprint.

The known offset printing process is less costly than copperplate but does not enable such fine and precise designs and reliefs to be obtained. Offset printing plates are used with a fairly liquid ink and the imprint is plane.

In copperplate machines, it is necessary to have a great pressure between the impression cylinder and the plate cylinder, since the paper must be pressed very strongly against the engraved grooves to pick or to suck out the relatively viscous ink from the grooves. In contrast, with the offset process it is not necessary to apply a great pressure between the offset or blanket cylinder on the one hand and the plate and impression cylinders on the other hand. There are thus lesser mechanical stresses in offset machines which are not so heavy and do not require the same robust static structure as copperplate machines.

The present invention proposes a process of manufacturing intaglio printing plates which can be used in the economically advantageous offset printing process, which plates having the same characteristics as copperplate plates for direct plate printing insofar as concerns precision, complexity and finesses of the designs and variation of the depths of grooves.

The process of manufacturing an intaglio printing plate according to the invention comprises providing a plate engraved for copperplate printing and having at least a superficial layer of a first material which retains a wetting agent to become ink repellent; applying over all the surface of this plate including the engraved grooves at least one layer of a second ink-accepting material which adheres strongly to the plate and partly fills the engraved grooves to define recesses of a desired depth and form; and removing the second material from the surface of the plate outside said recesses, this removing step comprising a mechanical treatment.

The invention also concerns an intaglio printing plate having at least a superficial layer of a first material which retains a wetting agent to become ink repellent, said layer of first material defining an outer non-printing surface of the plate and also defining the bottom of copperplate-engraved grooves in the plate, and an ink-accepting second material partly filling said grooves to define concave recesses in the plate surface.

Such a plate may be used in a wet offset machine, and cooperates with a blanket cylinder.

The invention thus enables a combination of the advantages of the offset process, concerning the printing machine, and of the copperplate process, concerning the quality of the imprint.

The invention will now be described in further detail with reference to the accompanying drawings, in which:

FIG. 1 is a schematic cross-section made through a printing plate during manufacture; and FIG. 2 shows the same plate at the end of manufacture.

One starts with a plate 1 engraved as for copperplate printing and formed for example of copper, nickel or iron, having hollow grooves 5 of different depths and which may represent a very complex design. The plate has a superficial layer 2 in a material accepting an ink-repellent wetting agent, for example in chromium. The superficial layer 2 could, however, be in other materials such as anodised aluminium. On the surface of this engraved plate is then applied a thin uniform layer 6, having a thickness of the order of 0.01 to 0.1 mm, of an enamel varnish which hardens under the effect of light, for example those available under the Trade Marks EMAILIT and PHOTORESIST, or another substance well known for the preparation of offset or photomechanical plates in lithography. This layer 3 of enamel adheres strongly to the plate surface and forms, after exposure, a hard surface. The layer 3 is preferably applied manually by means of a piece of cloth or felt, or a brush, by rubbing over all of the surface of the plates so that all of the grooves are partially filled with this material and the surface of this material in the grooves is concave, as shown schematically in FIGS. 1 and 2. The material in the grooves 5 thus defines recesses of a desired depth and shape. These recesses are of lesser depth than the original grooves; the depth of the recesses can be from 0.03 to 0.12 mm, i.e. suitable for offset printing.

The layer 3 is then hardened by exposure to light. The following phase consists of removing the layer 3 from the plane or non-recessed surface to make the layer 2 appear. This removal is carried out by mechanically treating the surface, for example by manual scraping or emery-polishing, or by means of an appropriate tool or machine, as will be described later.

The enamel which hardens upon exposure to light could be replaced by anothr enamel or varnish, in particular heat-hardenable ones, able to form a hard ink-accepting layer adhering well to the plate. The layer 3 could for example be formed by a synthetic resin or varnish such as the thermo-hardenable epoxy varnish available under the Trade Mark EPOXYDOR 2. After application, this two-constituant epoxy varnish is hardened by heating in an oven to 180° for 2 or 3 hours, and then allowed to cool. A single-constituent epoxy varnish could alternatively be used; or the synthetic varnish available under the Trade Mark SINTORO; the nitro-cellulose based varnish available under the Trade Mark SILA; or well-known acrylic enamel varnishes available on the market.

In the case of a thermo-hardenable enamel, varnish or resin, the plate may be heated to harden the material either before or after the mechanical treatment for removal of the layer from the non-recessed surface. This mechanical treatment can be carried out as soon as the layer 3 is dry; complete hardening of the material remaining in the grooves can then be carried out after the mechanical treatment. This is particularly appropriate for the complete hardening of thermo hardenable varnishes and the baking of thermo-hardenable enamels.

Generally speaking, the grooves can be coated with any plastics material that can be applied to the plate in a layer, is hardenable and accepts ink when hardened.

The thickness of the layer 3 in the grooves can, if desired, be increased by applying one or more additional coatings in the same manner as before.

Instead of manually applying the layer(s) 3 of hardenable material as previously described, other means and devices can be employed, for example spray guns, or centrifugal machines.

The material of layer 3 may also be an ink-accepting metal such as copper, nickel or iron, deposited chemically or electrolytically to form a layer having a thickness from several hundredths of a millimeter to about 0.1 mm. An even thinner metal layer of only several microns could also be provided, especially when it is desired that the original dimensions of the grooves should not be appreciably reduced.

The layer 3 of the non-grooved part is preferably removed by means of a ball-graining machine. To this end, the printing plate is mounted in a ball-graining machine of which the balls 4 are shown on FIG. 2 in chain lines. This type of graining machine is well known for plate polishing or rectifying operations. The plate to be treated is placed in a metal frame suspended by hooks from, for example, four cables, and this frame is oscillated preferably with a circular movement obtained by a rotating eccentric mass. The surface to be treated, which is placed uppermost, is covered with a multitude of steel or porcelain balls 4 of different diameters which roll and rub against one another and against said surface to produce a uniform wear. So that only the surface outside the grooves or recesses is effected by this abrasive treatment, the balls 4 must not be able to penetrate into the grooves. As the largest grooves may have a width of up to 0.2 mm for example, the diameter of the smallest balls must be greater than this dimension, and is preferably at least three times greater than the greatest width of the grooves, so as to avoid the upper edges of the grooves being dulled during polishing. Preferably, the plate surface is wetted during this treatment, principally in order to wash away the removed material. The graining operation is stopped when the layer 3 has entirely disappeared from the non-printing surface, allowing the underlying superficial layer 2 of chromium to appear. As can be seen in FIG. 2, the material of layer 3 remaining in the grooves thus has polished edges flush with the outer non-printing surface of the plate.

The plate is then removed from the graining machine and may be submitted to supplementary treatments for example to improve the property of the chromium layer to retain the wetting agent. The plate may then be bent and fixed on the cylinder of a printing machine.

It has been observed that treatment of the plate by a graining machine not only perfectly removes the layer(s) of unwanted material from the "planium" or non-grooved surface, but also provides a finished surface of chromium that has good characteristics for retaining a wetting agent.

If the layer 3 is formed of a synthetic varnish or resin, the described mechanical treatment may be facilitated by taking a piece of cloth impregnated with a solvent able to dissolve the synthetic resin or varnish, and rubbing the surface of the plate to partly remove the dried layer 3 of synthetic resin or varnish from the surface of the planium or not-grooved part. The solvent penetrating in the grooves has no undesirable effect.

A plate produced as described above may advantageously be used in an offset printing machine, the plate having a design of a precision and complexity analogous to that of a copperplate plate while using an ink of similar quality to that used in the conventional offset process with the use of a wetting device and the application of a normal relatively low pressure between the impression cylinder and the blanket cylinder. It has been observed that imprints thus obtained with a plate according to the invention are very difficult to counterfeit.

It is recalled that in very high quality security papers, there are two types of imprint, namely a security background, for example printed by the conventional dry offset process, and, superimposed thereon, a principal design printed for example by the copperplate process.

Advantageously, the described printing plate is incorporated in an offset machine where, in a single pass of the paper, a security background is printed by the conventional dry offset process and the principal design by the new wet offset unit using said plate. Such a printing machine has a blanket cylinder which cooperates both with at least one conventional offset plate and with at least one plate obtained by the described process. Said blanket cylinder cooperates either with an impression cylinder or, in the case of simultaneous recto-verso printing, with a second blanket cylinder cooperating with the same dry and wet offset system as the first.

The plates according to the invention can also be used as direct plate intaglio printing plates.

What is claimed is:

1. A process for manufacturing an intaglio printing plate for offset printing comprising the steps of:

- providing a plate having a surface with non-printing surface areas and engraved printing grooves for copperplate impression printing, a layer of a first material which retains a wetting agent to become ink repellent on said non-printing surface areas,
- applying over all of the surface of said plate including the engraved grooves a 0.01 to 0.1 mm thick layer of a second material which is hardenable and has ink accepting properties and which adhers strongly to the plate and partly fills the engraved grooves with said second material to define concave recesses of a depth and form for offset printing, said second material being a synthetic resin base varnish,
- hardening said layer of said second material, and thereafter
- mechanically removing said second material from the non-printing surface areas of the plate outside of said grooves and simultaneously polishing edges of said second material, in said engraved grooves, flush with said non-printing surface, while leaving intact said layer of said first material on the non-printing surface areas and said second material within said grooves.

2. A process according to claim 1, in which said mechanical removing step comprises suspending the plate in a ball-graining machine, placing graining balls on the surface of the plate, the diameter of the smallest ball being greater than the width of the widest recess, and oscillating the plate.

3. A process according to claim 1, in which said first material is chromium.

4. A process according to claim 1, comprising using as said second material a varnish with a synthetic resin base selected from the group consisting of epoxy and acrylic resin.

5. A process according to claim 1, comprising using as second material an enamel varnish which hardens upon exposure to light.

6. A process according to claim 1, in which said second material remaining in said grooves is subjected to a further hardening step after removal of said second material from said non-printing surface areas.

7. A process according to claim 1, comprising the further step, before said mechanical treatment, of partly removing the layer of varnish by means of a piece of cloth impregnated with a solvent of the varnish.

8. A process according to claim 13, in which said grooves are partly filled with said second material to the extent that the resulting depth of said partly filled grooves is 0.03 to 0.12 mm.

9. A process according to claim 1, in which said layer of first material covers the entire surface of said plate including said non-printing surface areas and said engraved printing grooves.

* * * * *